United States Patent [19]

Williams

[11] Patent Number: 5,406,227

[45] Date of Patent: Apr. 11, 1995

[54] METHOD AND APPARATUS FOR CONTROLLING RF SPECTRAL SPLATTER INTO ADJACENT CHANNELS WHEN ACTIVATING AN RF TRANSMITTER

[75] Inventor: James W. Williams, Lynchburg, Va.

[73] Assignee: Ericsson GE Mobile Communications Inc., Research Triangle Park, N.C.

[21] Appl. No.: 113,096

[22] Filed: Aug. 30, 1993

Related U.S. Application Data

[62] Division of Ser. No. 791,283, Nov. 13, 1991, Pat. No. 5,278,519.

[51] Int. Cl.⁶ .......................... H03F 3/04; H03G 3/30
[52] U.S. Cl. ..................................... 330/306; 330/284; 330/305; 330/149
[58] Field of Search ............... 330/284, 145, 305, 149, 330/306; 455/114, 119, 120, 123, 125, 127; 307/520, 521, 542, 543; 328/167

[56] References Cited

U.S. PATENT DOCUMENTS

| | | | |
|---|---|---|---|
| 3,023,369 | 2/1962 | Horowitz | 330/283 |
| 3,256,381 | 5/1962 | Cookerly et al. | 84/1.27 |
| 4,048,578 | 9/1977 | Kimura | 330/305 |
| 4,147,991 | 4/1979 | Ijichi et al. | 330/284 |
| 4,243,947 | 1/1981 | Glennon | 330/284 |
| 4,596,043 | 6/1986 | Leitch | 455/91 |
| 4,646,036 | 2/1987 | Brown | 333/81 |
| 4,673,886 | 6/1987 | Bickley et al. | 330/298 |
| 4,677,392 | 6/1987 | Yang | 330/284 |
| 4,689,498 | 8/1987 | Rinderle | 307/320 |
| 4,924,194 | 5/1990 | Opas et al. | 330/289 |
| 4,970,479 | 11/1990 | Landt et al. | 455/78 |
| 5,121,081 | 6/1992 | Hori | 330/279 |
| 5,150,075 | 9/1992 | Hietale et al. | 455/127 |
| 5,152,004 | 9/1992 | Väisänen et al. | 330/284 |

FOREIGN PATENT DOCUMENTS

| | | |
|---|---|---|
| 2018854 | 12/1990 | Canada . |
| 0156398 | 10/1985 | European Pat. Off. . |
| 0405445A2 | 1/1991 | European Pat. Off. . |
| 2566206 | 8/1951 | France . |

OTHER PUBLICATIONS

"PIN Diode Operation and Design Trade-offs", Peter Sahjani, Joseph F. White, Applied Microwave Magazine, Spring 1991, p. 9.

Primary Examiner—Robert J. Pascal
Assistant Examiner—Tan Dinh
Attorney, Agent, or Firm—Nixon & Vanderhye

[57] ABSTRACT

A simple and effective "RF snubber" circuit resolves the problems associated with transient spectral noise caused by radio transmitter activation in nearby channels. By connecting an RF snubber circuit in parallel with the RF amplifier output, the rise time or turn-on characteristic of the RF signal generated by the transmitter is controlled. As a result, adjacent channel interference is substantially eliminated.

15 Claims, 4 Drawing Sheets

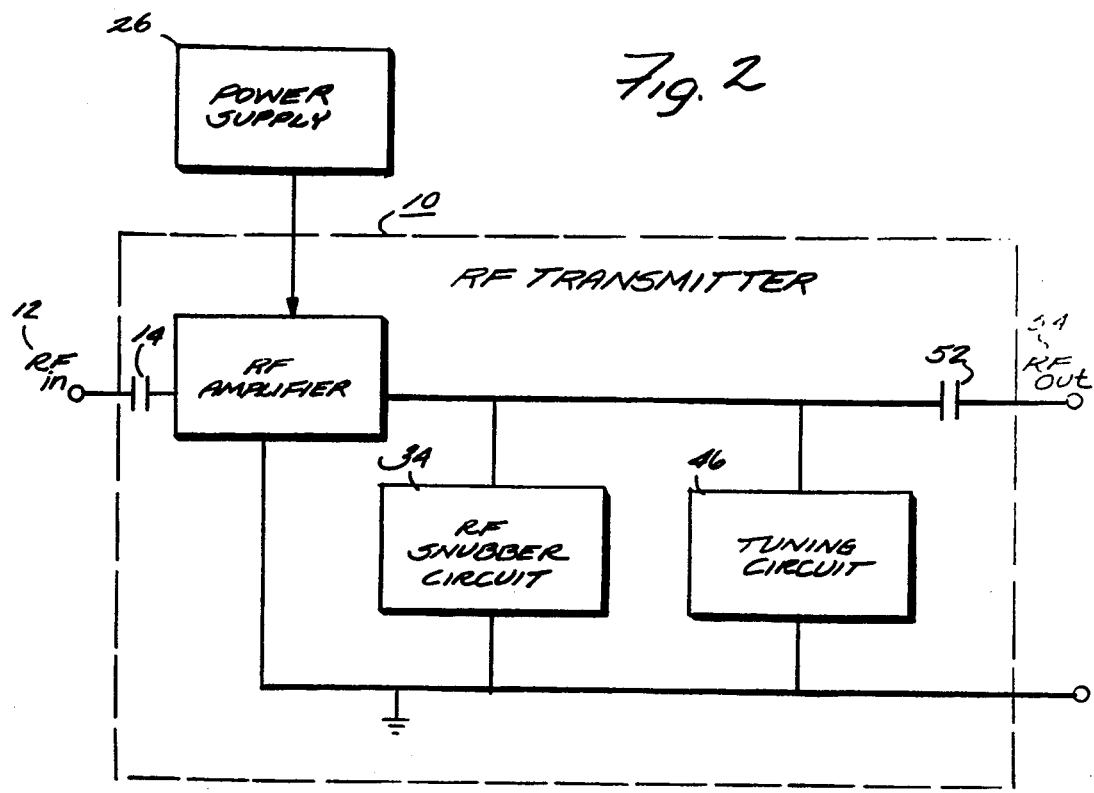
Fig. 2
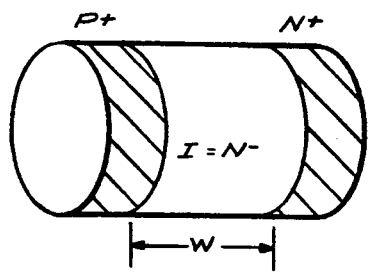
Fig. 4
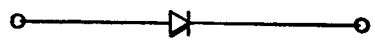

METHOD AND APPARATUS FOR CONTROLLING RF SPECTRAL SPLATTER INTO ADJACENT CHANNELS WHEN ACTIVATING AN RF TRANSMITTER

This is a division of application Ser. No. 07/791,283, filed Nov. 13, 1991, and now U.S. Pat. No. 5,278,519.

FIELD OF THE INVENTION

The present invention relates to radio frequency (RF) amplifiers and more particularly to a method and apparatus for controlling RF spectrum splatter transients during initial activation of an RF transmitter.

BACKGROUND AND SUMMARY OF THE INVENTION

Of the various types of known RF amplifiers, Class A, B, and AB amplifiers are inefficient compared to Class C amplifiers. Because of their efficiency, Class C amplifiers are often used in radio transmitters. By definition, a Class C amplifier is biased so that its quiescent state is "off". Upon receiving an input RF signal, the Class C amplifier generates a somewhat distorted, amplified RF output signal, and a tank circuit tuned to the desired output frequency effectively re-shapes the amplified RF signal.

Class C amplifiers can have extremely fast self-activation or "turn-on" times. Once the amplifier receives an input RF signal, the rise time of the output RF signal envelope can be extremely fast. The rise time is defined for purposes of the present invention as the time period it takes for a transmitted RF signal to increase from essentially zero power to full transmitter power. A graph of radio transmitter power in decibels (dB) versus time (msec) is shown in FIG. 1A. For purposes of illustration, only the envelope of the output RF signal is shown. The transmitter is turned "on" at approximately the 5 millisecond mark on the illustrated time scale, and the transmitted signal increases from an average quiescent noise level of $-80$ dB to full RF carrier power, characterized as zero dB, in a few microseconds. In fact, the rise time of the Class C amplifier signal response is so fast that the RF envelope is nearly a step function.

The faster the rise time, e.g. the steeper the slope of the RF envelope, the wider the transient frequency spectrum effected by that signal. Conversely, the slower the rise time or the smaller the envelope slope, the narrower the band of transient frequency spectrum effected. The presence of RF energy outside of an assigned frequency band may spill over into adjacent channels and cause interference with other signal transmissions.

In radio frequency communication applications, different transmitters may be assigned to specific channels corresponding to particular frequency bands in the RF spectrum. Excessively abrupt activation of a transmitter assigned to one channel (having a preset bandwidth) may cause transient splatter in the RF spectrum and be detected as transient noise in adjacent channels. In fact, such transmitter turn-on noise may interfere with several (e.g. five or more) adjacent and nearby channels.

An example RF envelope of a radio transmitter using channel 1 is shown in FIG. 1A. The effect on an adjacent channel 2 of turning on that transmitter is illustrated in FIG. 1B. At the time the transmitter broadcasting on channel 1 in FIG. 1A is activated (at approximately the five millisecond mark on the illustrated time line), a sharp noise spike occurs in the adjacent channel 2. This noise spike is only 5 dB below full power and may even trip the squelch circuits of sensitive receivers tuned to channel 2. In any event, such a noise spike may cause significant errors in information then being transmitted over channel 2, especially if the information is digital data. During voice transmissions over channel 2, listeners may experience such cross-channel noise spikes as loud clicks or pops on the channel.

This kind of interference is even more of a problem in certain radio applications. In conversations carried on between two portable radio transceivers, for example, each transceiver may be activated many times over a short time interval. In other words, every time a user wishes to talk, that user activates his transmitter causing interference to one or more adjacent channels.

Prior art transmitter designers have recognized the need to control amplifier gain. However, prior art amplifier's fail in some cases to sufficiently suppress interchannel noise caused by transmitter turn-on transients. This is especially so at higher carrier frequencies with closely spaced channels. There is need for an economical and effective mechanism that can be incorporated into typical RF transmitter/amplifier circuitry to control the speed with which radio transmitters turn on so as to minimize such interference effects on adjacent channels.

The present invention provides a simple and effective mechanism for reducing such transient noise caused by radio transmitter activations. By connecting an "RF snubber" circuit in parallel with the transmitter output, RF envelope rise time may be slowed considerably, As a result, adjacent channel interference is substantially eliminated.

In brief summary, an RF envelope detector can be used in conjunction with an RC circuit to self-generate a transient control circuit during abrupt envelope increases. In turn, the transient control circuit automatically and temporarily functions as an RF attenuator to slow the actual envelope rise time. Suitable static discharge resistance may also be used to reset automatically the circuit for use at the next transmitter activation.

An exemplary RF snubber circuit takes advantage of the operational characteristics of a PIN diode at radio frequencies. Initially, the PIN diode functions as a half wave rectifier to generate a DC current which is accumulated on a small first series-connected capacitor. In other words, the PIN diode and capacitor act as an envelope detector. As the RF envelope increases, the envelope detector automatically powers an RC time delay circuit. In particular, DC current flows through an RC circuit (a series connected resistor and a second capacitor) shunt-connected across the first capacitor to result in a sustained yet transient biasing current for the PIN diode. This causes the PIN diode to temporarily act like a resistor with respect to the transmitted RF signal. The first capacitor acts as an RF bypass for the RF signal, and thus, effectively connects the PIN diode directly across the RF amplifier output. The shunt PIN diode resistance loads the amplifier output and temporarily attenuates it.

The second capacitor through which the biasing current flows is, in this exemplary embodiment, large relative to the value of the first (RF bypass/charging capacitor) that couples the diode to ground. Consequently, the second capacitor maintains a diode bias current for a significant time interval, and in the process, slows the rise time of the RF envelope across the now resistive PIN diode. In other words, the first capacitor acts to keep the PIN diode effectively connected in shunt across the RF output while the RC time constant of the biasing current through second capacitor keeps the PIN diode resistive. Consequently, the rise time or turn-on characteristic of the RF envelope is reduced or slowed sufficiently to prevent spurious transient turn-on interference in adjacent channels.

The PIN diode of the present invention does not require an externally controlled bias current in order to achieve the desired resistive characteristic at transistor turn-on time. The bias current is self-adjusting using simple, passive circuit components. Once the transmitter RF envelope has reached a steady or constant power level, the capacitors reach a steady state dc voltage and the PIN diode bias current automatically disappears—thus removing undesirable RF loading and attenuation during ongoing transmitter operation. No external voltage source or control mechanism is required to actively bias the PIN diode; no external device or signal is required to remove the biasing current.

BRIEF DESCRIPTION OF THE DRAWINGS

FIG. 2 is a functional block diagram of an exemplary embodiment of the present invention;

FIG. 4 illustrates a typical PIN diode;

DETAILED DESCRIPTION OF EXEMPLARY EMBODIMENTS

Figure 1A:
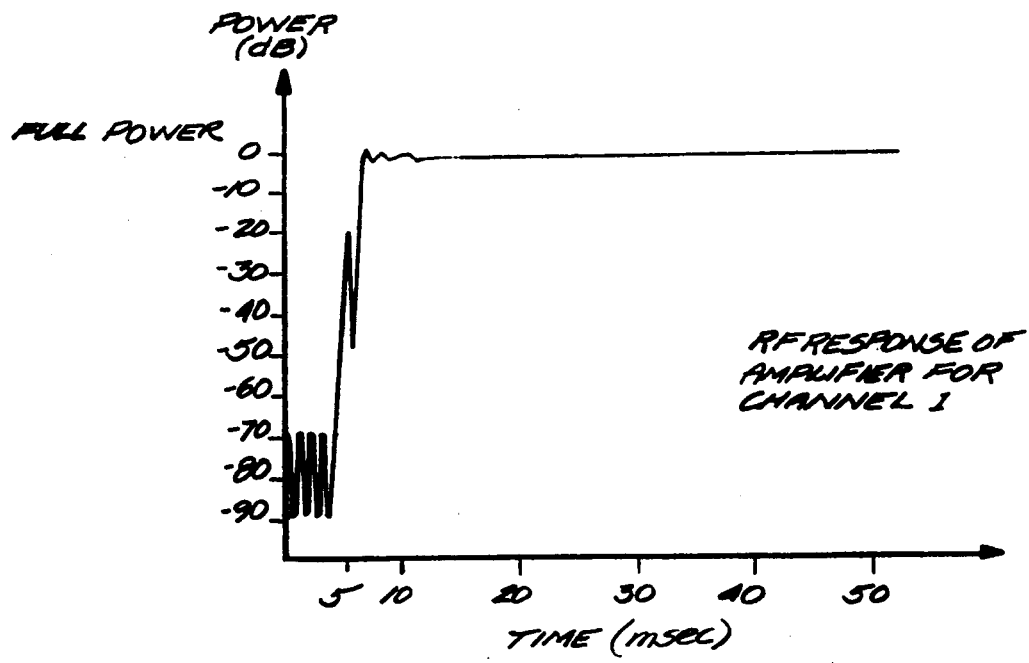
FIG. 1A shows a typical RF turn-on envelope at the time a radio frequency transmitter is activated.
Figure 1B:
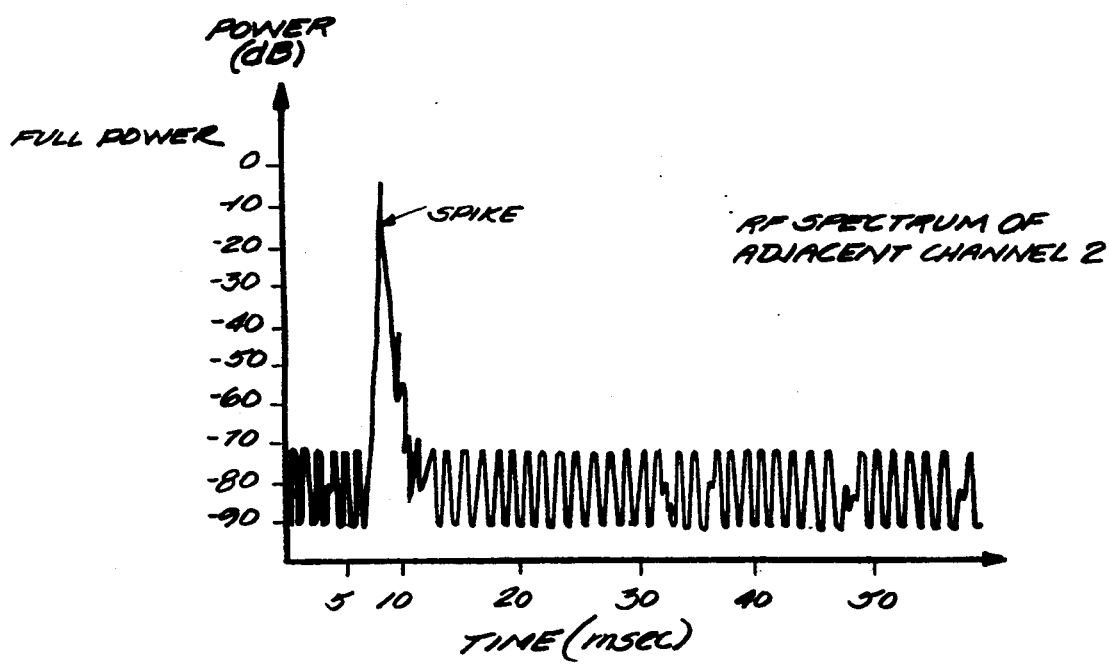
FIG. 1B shows the typical spurious RF spectrum transient generated in an adjacent channel resulting from the activation depicted in FIG. 1A.

In the exemplary embodiment shown in FIG. 2, RF amplifier 16 of RF transmitter 10 receives an RF input signal 12 through a dc blocking and RF coupling capacitor 14. The RF amplifier 16 is characteristically a Class C amplifier which is biased to cutoff until it receives RF input signal 12. A dc power supply 26 provides the necessary dc operating power.

When RF amplifier 16 receives an RF input signal 12, it self-activates or turns "on". It also automatically activates an RF snubber circuit 34 shunt connected across the amplifier output to slow the effective turn-on time of the amplifier output signal—thus preventing transient RF spectral noise on adjacent frequency channels. An exemplary RF snubber circuit 34 will be described in considerably more detail below. The amplified output signal from the RF amplifier 16 drives a conventional tuned tank circuit 46 which provides the RF output signal 54 through RF coupling capacitor 52.

Figure 3:
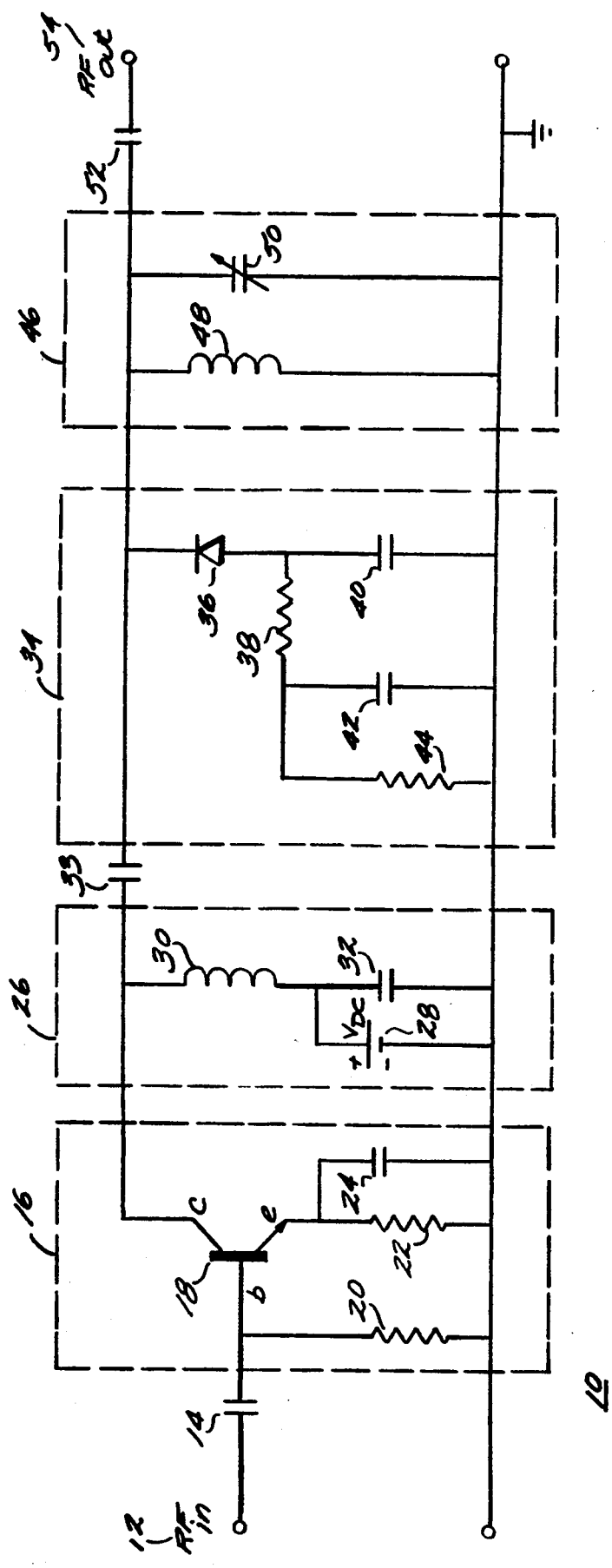
FIG. 3 is a schematic diagram of an exemplary embodiment of the present invention.

A more detailed circuit schematic of an exemplary embodiment of the present invention is shown in FIG. 3. RF input signal 12 is received by RF amplifier circuit 16 through RF coupling capacitor 14. The RF amplifier 16 includes bipolar junction transistor 18. Connected to the base of transistor 18 is the usual base-emitter resistor 20. Connected to the emitter of transistor 18 are the usual bias resistor 22 (to determine the slope of the amplifier operating line) and RF bypass capacitor 24.

The conventional power supply 26 includes a dc voltage supply 28 connected to the collector terminal of transistor 18 through the usual radio frequency "choke" inductor 30. The voltage supply 28 is also shunted by an RF bypass capacitor 32 which isolates the dc power supply 28 from the RF signal.

The RF output of RF amplifier 16 is connected to RF snubber circuit 34 through RF coupling capacitor 33. RF snubber circuit 34 includes PIN diode 36 connected in series with an RF bypass charging capacitor 40 to ground. Across the RF bypass charging capacitor 40, an RC time delay bias circuit is connected including resistor 38 and capacitor 42. Static discharge resistor 44 is also provided to insure bleed off of residual capacitor charges when the transmitter is turned off—thus automatically resetting RF snubber 34 for another cycle of operation when the transmitter is again activated.

The operation of PIN diode 36 will now be described in further detail with regard to FIG. 4. The basic structure of the PIN diode consists of a high resistivity intrinsic region (I region) bounded by highly acceptor-doped (P+) and donor-doped (N+) regions, both of which have high conductivity. With no bias current applied, or if a reverse bias voltage is applied, the diode functions as a capacitor.

At very low values of forward bias current very few carriers (holes and electrons) exist in the I region. The diode's conductivity to an RF signal is under these conditions low, producing a high resistance (plus possibly some capacitance). If forward bias current increases, more carriers are injected into the I region, resulting in decreased resistance. Accordingly, a PIN diode may be viewed as a capacitor (when at zero or reverse bias) with an electronically variable resistance (when forward biased) whose resistance value may be controlled by varying its forward bias current. For more information regarding PIN diodes, see "PIN Diode Operation and Design Trade-Offs," P. Sahjani and J. F. White, *Applied Microwave*, Spring 1991, pp. 68–78.

PIN diodes are used in radio frequency environments as attenuators—even to control the gain of RF amplifiers. However, the prior art typically requires an external source of controlled dc bias current to control the PIN diode. In the present invention, the PIN diode 36 does not require a controlled bias current from an external source. Rather, it will be seen from the following description that the PIN diode 36 as used in the present invention is self-actuated and self-adjusting.

Returning to FIG. 3, when transmitter 10 is turned on, and in the absence of this invention, the RF envelope climbs very sharply to full power as shown in FIG. 1A. As the output RF signal starts to build across tuned circuit 46 (inductor 48 in parallel with capacitor 50), PIN diode 36 rectifies the rising amplitude RF output signal. As the dc voltage level rises with the RF envelope, a transient dc bias current flows for the PIN diode through RC circuit 38, 42.

The transient dc current flowing through capacitor 42, resistor 38 and PIN diode 36 functions as a dc biasing current for the PIN diode. With that forward biasing current, the PIN diode 36 temporarily acts as a loading resistor attenuating the RF output signal. However, when a steady state RF envelope amplitude is reached, the biasing current becomes zero. Accordingly, the PIN diode 36 no longer functions as a resistive load. The RF snubber circuit 34 is thus effectively open circuited and can be considered either removed from the transmission circuit 10 or as a relatively constant capacitance which can become part of the tank circuit.

Thus, the RF snubber circuit 34 is self-actuating; no external source of voltage is required to generate the requisite transient dc biasing current for the PIN diode 36. The biasing current is applied to the PIN diode 36 simultaneously with transmitter activation. It is the changing (increasing) rectified RF signal envelope that makes the snubber circuit 34 self-actuating.

The snubber circuit 34 is self-regulating for two reasons. First, the faster the rise time of the RF envelope, the greater the transient bias current pulled through the RF snubber circuit 34. The RF snubber functions temporarily like a resistor in parallel with the tuning circuit 46 to attenuate the RF envelope during turn-on. Second, when the transmitter has reached full power, the RF snubber circuit capacitors 40 and 42 effectively remove the snubber circuit.

The RC time constant of the biasing current through the resistor 38 and capacitor 42 control the resultant rise time and shape of the RF envelope. The value of the capacitor 42 is in this embodiment much greater than that of the capacitor 40 and it effectively resists too rapid an increase in its voltage. The relatively large RC time constant of RC circuit 38, 42 causes the slope of the RF envelope to decrease and "roll off" smoothly in accordance with the known equation for current through a capacitor:

$$i(t) = V/R \exp(-t/RC)$$

By appropriately selecting the values of capacitor 42 and resistor 38, the shape of the RF envelope can be smoothed to avoid an abrupt change in RF output power. That is, the rise time of the RF envelope can be controlled to reduce interference on other channels otherwise caused by turning on the transmitter 10.

A further feature of the present invention is the connection of a very large static discharge bleeder resistor 44, e.g., 10 megaohms, in parallel with capacitor 42. Resistor 44 has two functions. First, it is sufficiently large so as to not materially affect the voltage across the resistor 44, capacitor 42, and capacitor 40 during circuit operation. Second, it is sufficiently small to discharge capacitors 40 and 42 within a reasonable time of stored charge when the transmitter 10 is turned off. As a result, the RF snubber circuit will be immediately preset to operational readiness for use the next time transmitter 10 is activated.

Figure 5A:
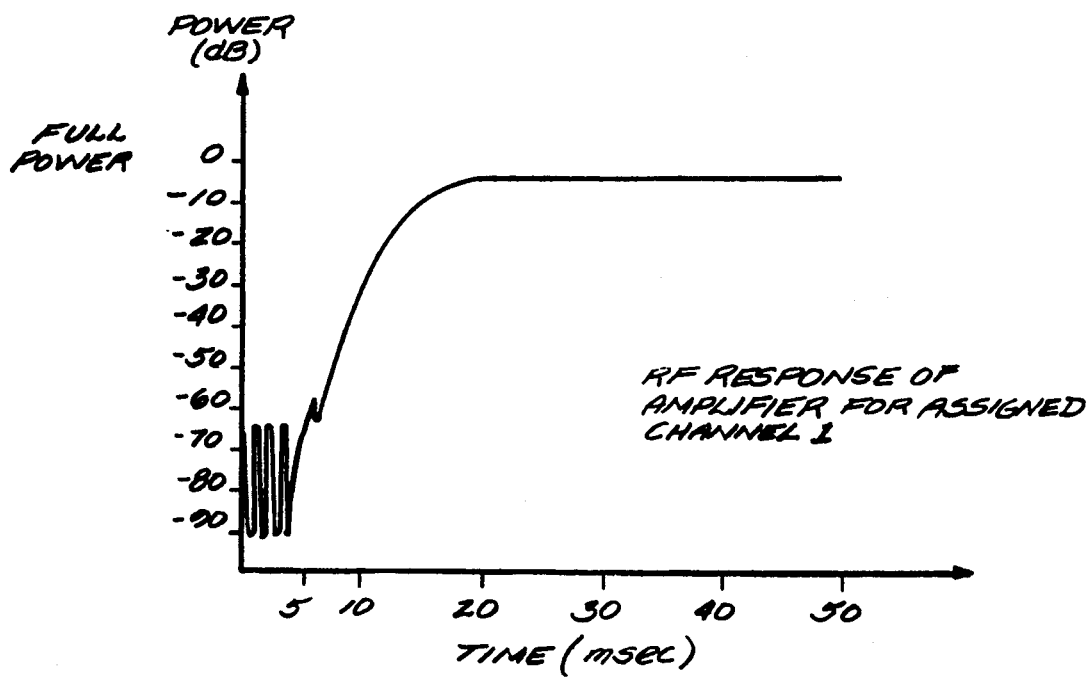
FIG. 5A shows the RF turn-on envelope response of an amplifier utilizing the present invention.
Figure 5B:
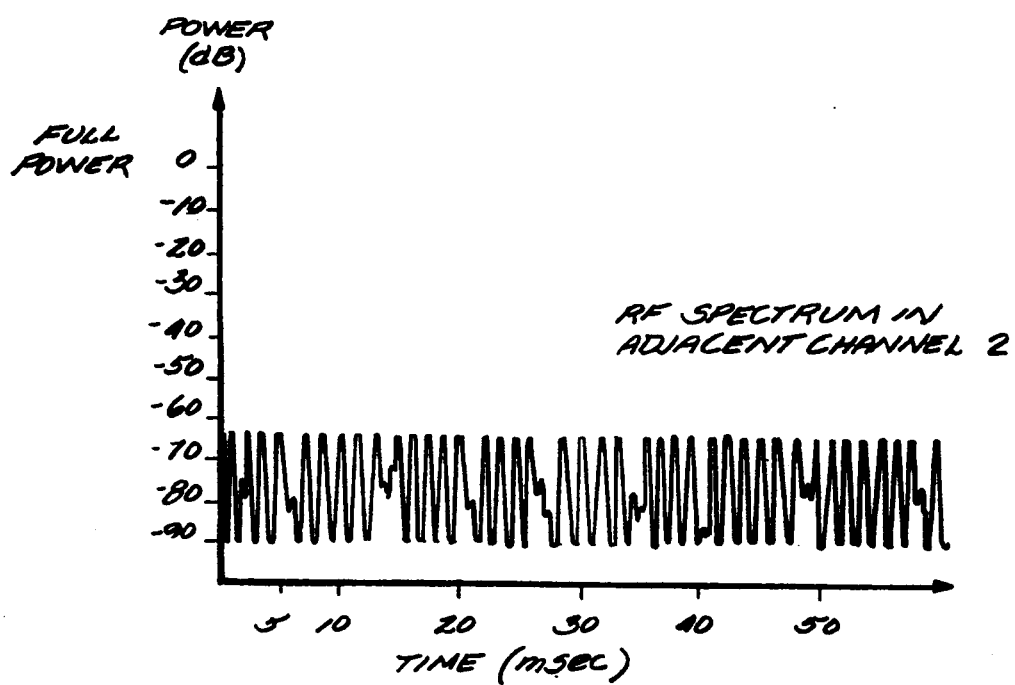
FIG. 5B shows the radio frequency spectrum in an adjacent channel during the activation response shown in FIG. 5A.

The RF turn-on envelope in channel 1 and the related RF spectrum in an adjacent channel 2 for an RF transmitter incorporating the beneficial effects of the present invention are shown in FIGS. 5A and 5B. Under the same conditions as those illustrated in FIG. 1A, FIG. 5A shows that when the transmitter 10 is activated, the rise time to full power for the RF envelope is slowed down considerably. In other words, the slope of the turn-on curve has been decreased so that RF power is increased to full power in a more gradual, controlled manner. In addition, the shape of the curve has been modified so that it "rolls over" smoothly rather than making a sharp, square wave like transition. As a result, in FIG. 5B, the RF spectrum in an adjacent channel 2 is no longer affected by the turning on of a transmitter on channel 1. Voltage spikes or transients in adjacent channels are substantially eliminated.

In one exemplary embodiment, RF bypass capacitor 40 is 100 picofarads, resistor 38 is 47 kilohms, capacitor 42 is 0.047 microfarads and static bleeder resistor 44 is 10 megohms.

From the foregoing description of an exemplary embodiment, those skilled in the art can readily modify or adapt for various applications such embodiments while yet retaining novel features and advantages of the invention. Therefore such adaptations and modifications are intended to be comprehended as equivalents of the disclosed embodiment. It is to be further understood that the terminology employed herein is for the purpose of description and not of limitation.

What is claimed is:

1. An RF transmitter, comprising:
   an RF amplifier having a tuned output circuit; and
   means connected across an output of the RF amplifier for substantially eliminating interference in adjacent frequencies caused by activation of the RF amplifier when initially presented with an input RF signal.

2. A transmitter according to claim 1, wherein the means for substantially eliminating includes:
   a series-connected diode and first capacitor connected across the amplifier output; and
   a series-connected resistor and second capacitor connected across the first capacitor for providing a biasing current to the diode during initial activation of the RF amplifier by an input RF signal.

3. A transmitter according to claim 2, wherein the amplifier is a class-C amplifier and the diode is a PIN diode.

4. A transmitter according to claim 2, wherein a time constant of the biasing current is substantially longer than a rise time in which the amplifier would otherwise generate a full power output signal after initial activation.

5. A transmitter according to claim 2, further comprising:
   a second resistor in parallel with the second capacitor for discharging the capacitor when the transmitter is deactivated.

6. A method for controlling a PIN diode RF connected across the output of an RF amplifier, comprising:
   controlling a PIN diode biasing current in response to changes in the RF signal output of said RF amplifier, wherein an increase in the RF signal output generates the PIN diode biasing current.

7. A method according to claim 6, wherein the generating step comprises charging a capacitor and said method further comprises:
   discharging said capacitor when the amplifier RF signal output is reduced.

8. A radio frequency transmitter comprising:
   a radio frequency amplifier for producing an amplified RF output signal;
   a passive RF transient suppression circuit coupled to said RF output signal for automatically retarding the rate at which the amplitude envelope of said RF output signal increases.

9. A radio frequency transmitter comprising:
   a radio frequency amplifier having an input and an output;

an envelope detector coupled to the amplifier output for detecting the amplitude envelope of radio frequency signals at the amplifier output;

a transient control circuit coupled to the envelope detector for automatically generating a control signal during transient increases in said amplitude envelope; and a controllable radio frequency attenuator coupled to said control signal and to said amplifier output to automatically attenuate the output of said amplifier during said transient increases.

10. A radio frequency transmitter as in claim 9, wherein:

said envelope detector includes a series-connected PIN diode and first capacitance, said detector being RF shunt-connected across the amplifier output; and said transient control circuit includes a series-connected resistance and second capacitance, said control circuit being shunt-connected across said first capacitor.

11. A radio frequency transmitter as in claim 10, wherein said controllable radio frequency attenuator includes said PIN diode.

12. A radio frequency transmitter as in claim 10, further comprising:

a static bleeder discharge resistance connected in shunt across said second capacitor.

13. An RF transmitter, comprising:

an RF amplifier having a tuned output circuit;

a series-connected diode and first capacitor connected across the amplifier output; and a series-connected resistor and second capacitor connected across the first capacitor for providing a biasing current to the diode during initial activation of the RF amplifier by an input RF signal.

14. A method of controlling a PIN diode RF connected across the output of an RF amplifier, comprising:

generating a PIN diode biasing current in response to changes in the RF signal output of said RF amplifier to charge a capacitor connected to the PIN diode, and discharging the capacitor when the amplifier RF signal output is reduced.

15. A radio frequency transmitter, comprising:

a radio frequency amplifier having an input and an output;

an envelope detector coupled to the amplifier output for detecting an amplitude envelope of radio frequency signals at the amplifier output including a series-connected PIN diode and first capacitance connected across the amplifier output;

a transient control circuit coupled to the envelope detector for automatically generating a control signal during transient increases in the amplitude envelope; and a controllable radio frequency attenuator coupled to the control signal and to the amplifier output to automatically attenuate the output of the amplifier during the transient increases.

* * * * *